United States Patent [19]

New et al.

[11] Patent Number: 5,818,255

[45] Date of Patent: Oct. 6, 1998

[54] METHOD AND CIRCUIT FOR USING A FUNCTION GENERATOR OF A PROGRAMMABLE LOGIC DEVICE TO IMPLEMENT CARRY LOGIC FUNCTIONS

[75] Inventors: Bernard J. New, Los Gatos; Danesh Tavana, Mountain View, both of Calif.

[73] Assignee: Xilinx, Inc., San Jose, Calif.

[21] Appl. No.: 536,287

[22] Filed: Sep. 29, 1995

[51] Int. Cl.[6] .............................. H03K 7/38; H03K 19/21
[52] U.S. Cl. ................................................ 326/39; 326/53
[58] Field of Search .................... 326/53, 37, 39

[56] References Cited

U.S. PATENT DOCUMENTS

| 5,349,250 | 9/1994 | New ............................................... 326/53 |
| 5,386,156 | 1/1995 | Britton et al. .............................. 326/37 |
| 5,436,574 | 7/1995 | Veenstra .................................... 326/39 |
| 5,488,315 | 1/1996 | Mahant-Shetti et al. ................. 326/53 |

*Primary Examiner*—Edward P. Westin
*Assistant Examiner*—Richard Roseen
*Attorney, Agent, or Firm*—E. Eric Hoffman, Skjerven, Morrill, MacPherson, Franklin & Friel; Jeanette S Harms, Xilinx, Inc.

[57] ABSTRACT

A carry logic circuit for a programmable logic device which uses a single function generator to create a carry propagate signal (P) and an output signal (S). The function generator includes a plurality of signal generation circuits, each of which is controlled by a first input signal (A) and a second input signal (B). One of the signal generation circuits is programmed to provide a desired carry propagate signal (P) in response to the first and second input signals (A,B). The carry propagate signal (P) is transmitted for use outside of the function generator to perform a carry propagation function for the carry logic circuit. The remaining signal generation circuits are programmed to generate one or more intermediate output signals in response to the first and second input signals (A,B). These intermediate output signals, in combination with carry propagate signal (P), are representative of the desired output signal (S). The function generator also includes a signal selection circuit which is coupled to the signal generation circuits. The signal selection circuit passes a signal which is selected from the group consisting of the carry propagate signal (P) and the intermediate output signals, thereby providing the output signal (S).

17 Claims, 5 Drawing Sheets

METHOD AND CIRCUIT FOR USING A FUNCTION GENERATOR OF A PROGRAMMABLE LOGIC DEVICE TO IMPLEMENT CARRY LOGIC FUNCTIONS

BACKGROUND OF THE INVENTION

This invention relates to a structure and method of implementing carry logic in a digital circuit. More specifically, the present invention relates to a structure and method for using a function generator of a programmable logic device to implement carry logic.

DESCRIPTION OF THE PRIOR ART

Figure 1:
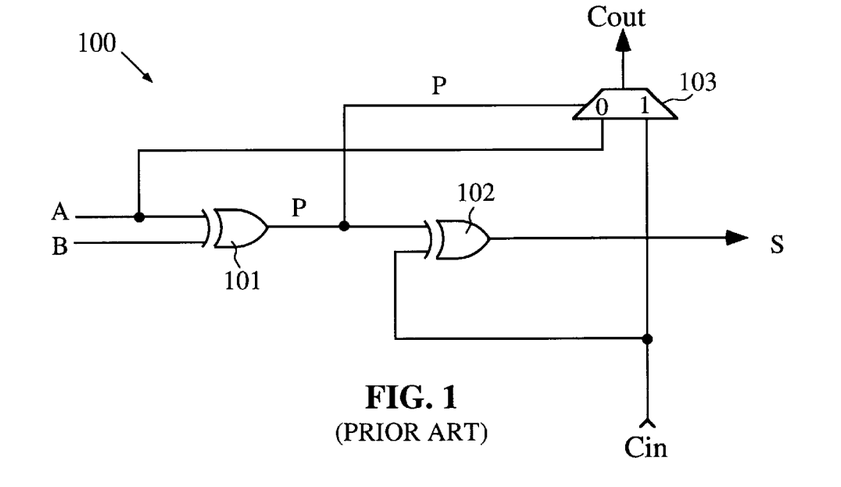
FIG. 1 is a schematic diagram of a conventional carry chain circuit.

FIG. 1 is a schematic diagram of a conventional carry chain circuit 100. Carry chain circuit 100 receives three input signals A, B and Cin, where Cin is a carry input signal received from another circuit (usually another carry chain multiplexer). Input signals A and B are applied to input terminals of exclusive OR gate 101. In response, exclusive OR gate 101 provides a carry propagate signal, P.

Carry propagate signal P is applied to an input terminal of exclusive OR gate 102. Carry input signal Cin is applied to the other input terminal of exclusive OR gate 102. In response, exclusive OR gate 102 provides a sum signal S.

The carry propagate signal P is also applied to a control input terminal of multiplexer 103. Input signal A is applied to the "0" input terminal of multiplexer 103 and the carry input signal Cin is provided to the "1" input terminal of multiplexer 103. Depending upon the value of carry propagate signal P, either input signal A or carry input signal Cin is transmitted through multiplexer 103 as carry output signal Cout. Table 1 is a truth table for carry chain circuit 100.

TABLE 1

| A | B | Cin | P | S | Cout |
|---|---|-----|---|---|------|
| 0 | 0 | 0   | 0 | 0 | 0    |
| 1 | 0 | 0   | 1 | 1 | 0    |
| 0 | 1 | 0   | 1 | 1 | 0    |
| 1 | 1 | 0   | 0 | 0 | 1    |
| 0 | 0 | 1   | 0 | 1 | 0    |
| 1 | 0 | 1   | 1 | 0 | 1    |
| 0 | 1 | 1   | 1 | 0 | 1    |
| 1 | 1 | 1   | 0 | 1 | 1    |

Carry chain circuit 100 is typically used to implement the arithmetic carry function for binary addition. In such an implementation, input signals A and B are binary bits to be added at a particular bit position, carry input signal Cin is a carry bit from a less significant bit position, and carry output signal Cout is a carry bit provided to a more significant bit position. Carry chain circuit 100 has been implemented in a number of different ways in programmable logic devices (PLDs) such as field programmable gate arrays (FPGAs). For example, exclusive OR gate 101 can be a dedicated (i.e., hard-wired) gate and exclusive OR gate 102 can be implemented using a function generator of the PLD.

Figure 2:
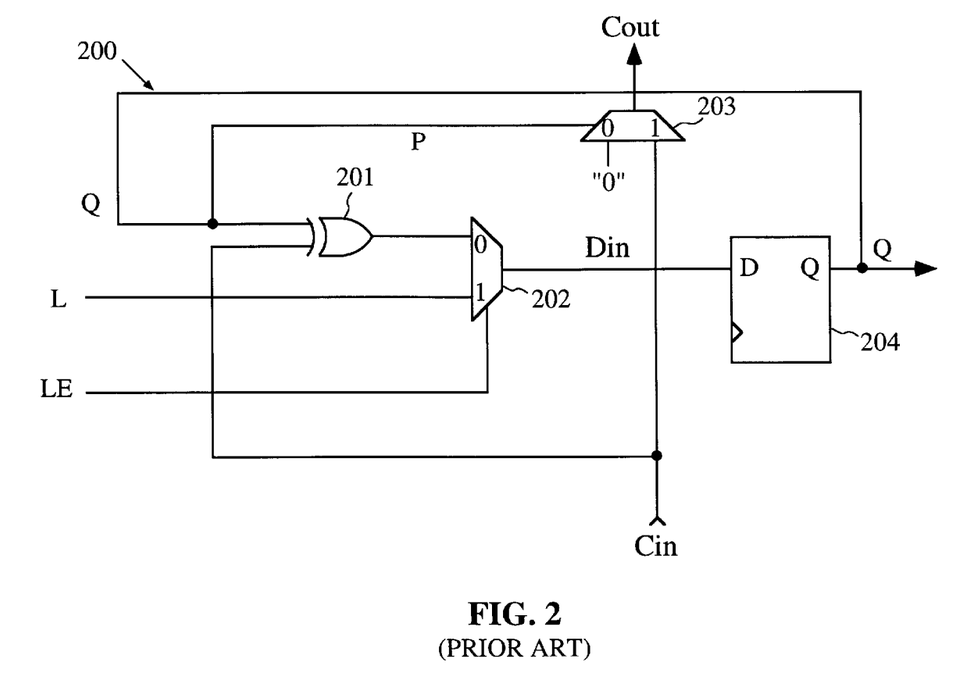
FIG. 2 is a schematic diagram of a conventional loadable counter circuit that uses carry logic.

FIG. 2 is a schematic diagram of a conventional loadable counter circuit 200 that uses carry logic. Loadable counter circuit 200 includes exclusive OR gate 201, multiplexers 202–203 and D flip flop 204. Signal Q represents the current count of circuit 200, signal Cin is a carry input signal from a previous counter circuit (not shown), and signal Cout is a carry output signal provided to a subsequent counter circuit (not shown). Current count signal Q is provided to one input terminal of exclusive OR gate 201. The other input terminal of exclusive OR gate 201 is connected to receive the carry input signal Cin. The output terminal of exclusive OR gate 201 is connected to the "0" input terminal of multiplexer 202. If the "0" input terminal of multiplexer 202 is selected, the output terminal of exclusive OR gate 201 is connected to the D input terminal of flip flop 204, thereby providing an input signal Din to flip flop 204.

Counter output signal Q is also provided to the control terminal of multiplexer 203 as a carry propagate signal P. If carry propagate signal P has a logic "0" value, a preprogrammed logic "0" value is routed through multiplexer 203 as carry output signal Cout. If carry propagate signal P has a logic "1" value, the carry input signal Cin is routed through multiplexer 203 as carry output signal Cout.

Load signal L is provided to the "1" input terminal of multiplexer 202 and load enable signal LE is provided to the control terminal of multiplexer 202 to allow counter circuit 200 to be loaded. To load counter circuit 200 with a particular value, load enable signal LE is given a logic "1" value, thereby enabling load signal L to be routed through multiplexer 202 to the D input terminal of flip flop 204 as input signal Din. Table 2 is a truth table for loadable counter circuit 200.

TABLE 2

| Q | L | LE | Cin | P | Din | Cout |
|---|---|----|-----|---|-----|------|
| 0 | 0 | 0  | 0   | 0 | 0   | 0    |
| 1 | 0 | 0  | 0   | 1 | 1   | 0    |
| 0 | 1 | 0  | 0   | 0 | 0   | 0    |
| 1 | 1 | 0  | 0   | 1 | 1   | 0    |
| 0 | 0 | 1  | 0   | 0 | 0   | 0    |
| 1 | 0 | 1  | 0   | 1 | 0   | 0    |
| 0 | 1 | 1  | 0   | 0 | 1   | 0    |
| 1 | 1 | 1  | 0   | 1 | 1   | 0    |
| 0 | 0 | 0  | 1   | 0 | 1   | 0    |
| 1 | 0 | 0  | 1   | 1 | 0   | 1    |
| 0 | 1 | 0  | 1   | 0 | 1   | 0    |
| 1 | 1 | 0  | 1   | 1 | 0   | 1    |
| 0 | 0 | 1  | 1   | 0 | 0   | 0    |
| 1 | 0 | 1  | 1   | 1 | 0   | 1    |
| 0 | 1 | 1  | 1   | 0 | 1   | 0    |
| 1 | 1 | 1  | 1   | 1 | 1   | 1    |

In one example, multiplexer 202 and exclusive OR gate 201 of loadable counter circuit 200 are implemented using a function generator of a PLD.

It would be desirable to have a circuit that is programmable to implement a variety of carry logic circuits, including carry chain circuit 100 and loadable counter circuit 200. It would also be desirable if this circuit can be implemented by programming a single function generator within a PLD.

SUMMARY

Accordingly, the present invention provides a carry logic circuit for a PLD which is implemented using one function generator. In accordance with one embodiment of the invention, a function generator is a 4-input, 1-output device that can be programmed to provide any function of the four inputs. The function generator includes a plurality of signal generation circuits. In one embodiment, each signal generation circuit is a look-up table which includes a multiplexer with input terminals coupled to configurable bit latches. The signals provided by each of the signal generation circuits are controlled by a first input signal A and a second input signal B.

One of the signal generation circuits is programmed to provide a desired carry propagate signal P in response to the first and second input signals A,B. Carry propagate signal P is transmitted for use outside of the function generator to perform a carry propagation function for the carry logic circuit. In addition to carry propagate signal P, the function generator also provides an output signal S. The remaining signal generation circuits (i.e., those not used to generate carry propagate signal P) are programmed to generate one or more intermediate output signals in response to the first and second input signals. These intermediate output signals, in combination with carry propagate signal P, are representative of the desired output signal S.

The function generator also includes a signal selection circuit coupled to the signal generation circuits. The signal selection circuit operates in response to a third input signal C and a fourth input signal E. In one embodiment, the third input signal C is received from logic forming circuitry of the PLD. Logic forming circuitry can include, for example, a flip flop or another function generator of the PLD. This logic forming circuitry is configured in a manner determined by the user. The fourth input signal E is selected from a group consisting of a fifth input signal D, which is also received from logic forming circuitry of the PLD, and a carry input signal Cin, which is received from another carry logic circuit. The signal selection circuit passes a signal which is selected from the group consisting of the carry propagate signal P and intermediate output signals, thereby creating the output signal S.

In this manner, the carry propagate signal P and the output signal S are both generated by a single function generator. Additionally, because the signal generation circuits are programmable, the above-described function generator can be used to implement many carry logic circuits, including, but not limited to, carry chain circuit 100 (FIG. 1) and loadable counter circuit 200 (FIG. 2).

The present invention also includes a method of generating a carry propagate signal P and an output signal S using a single function generator of a PLD. This method includes the steps of (1) providing a first input signal A and a second input signal B to a first signal generating circuit within the function generator, (2) generating a carry propagate signal P with the first signal generating circuit in response to the first and second input signals, (3) providing the first and second input signals to a second signal generating circuit within the function generator, (4) generating one or more intermediate output signals with the second signal generator in response to the first and second input signals, (5) using the carry propagate signal P to perform a carry propagation function, and (6) selecting one signal form the group consisting of the carry propagate signal P and the intermediate output signals within the function generator for use as the output signal S.

The present invention will be more fully understood in light of the following detailed description taken together with the drawings.

DETAILED DESCRIPTION

Figure 3:
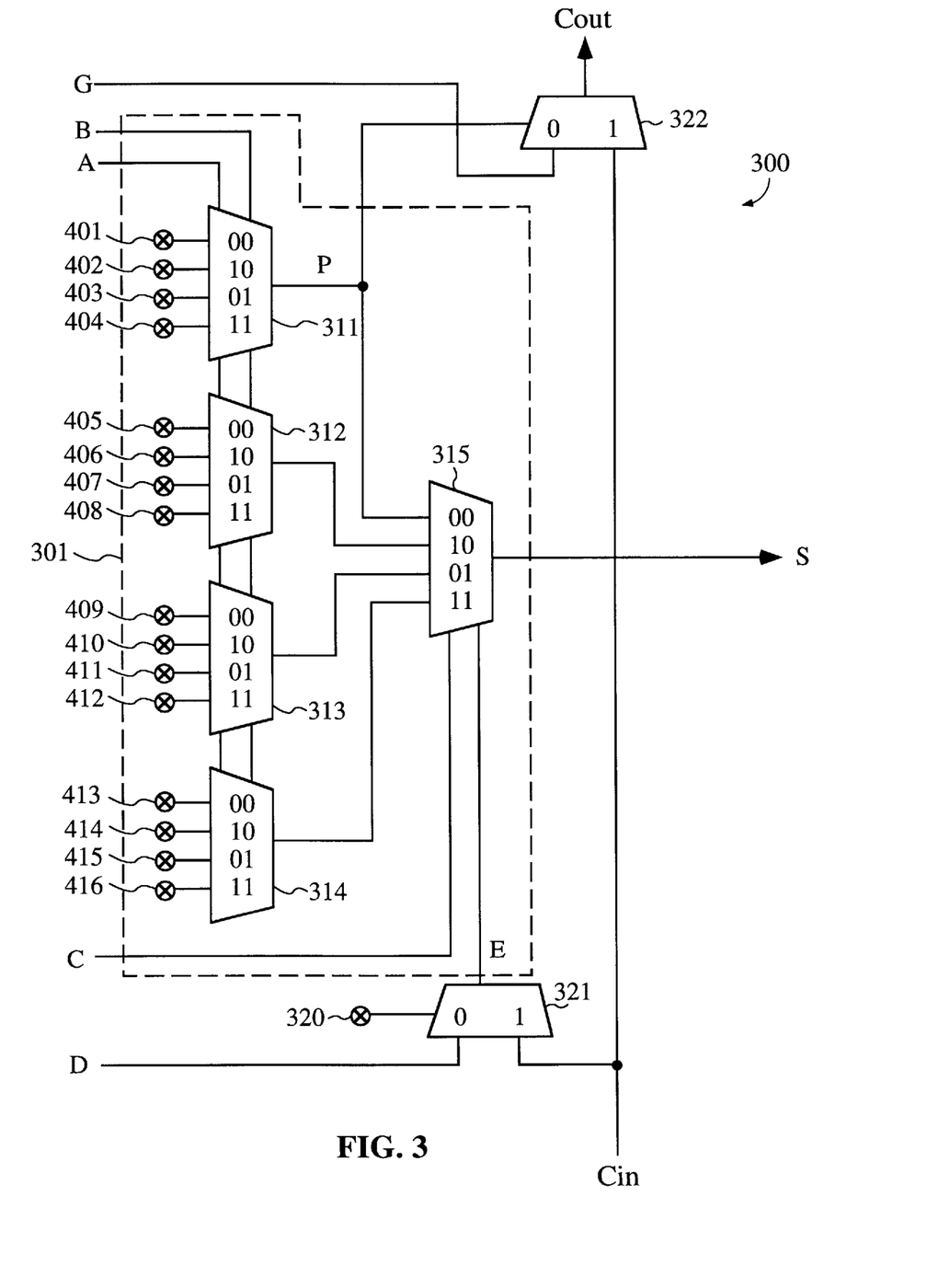
FIG. 3 is a schematic diagram of a carry logic circuit which is implemented using a single function generator of a PLD in accordance with one embodiment of the invention.

FIG. 3 is a schematic diagram of a carry logic circuit 300 which is implemented using a single function generator 301 of a PLD. Function generator 301 includes here five 4-to-1 multiplexers 311–315. The control terminals of multiplexers 311–314 are each coupled to receive input signals A and B. Input signals A and B are generated by conventional logic forming circuitry (not shown) of the PLD. Each of the input terminals of multiplexers 311–314 is connected to a corresponding one of configurable bit latches 401–416. Thus, the "00", "10", "01" and "11" input terminals of multiplexer 311 are coupled to configurable bit latches 401, 402, 403 and 404, respectively, the "00", "10", "01" and "11" input terminals of multiplexer 312 are coupled to configurable bit latches 405, 406, 407 and 408, respectively, the "00", "10", "01" and "11" input terminals of multiplexer 313 are coupled to configurable bit latches 409, 410, 411 and 412, respectively, and the "00", "10", "01" and "11" input terminals of multiplexer 314 are coupled to configurable bit latches 413, 414, 415 and 416, respectively.

Figure 4:
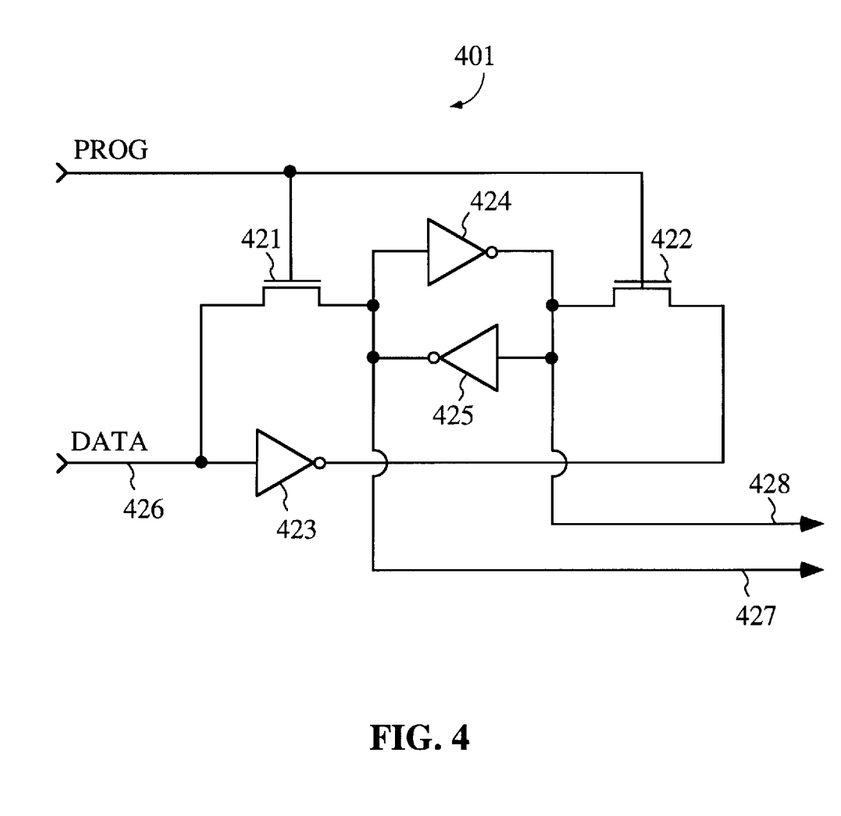
FIG. 4 is a schematic diagram of a configurable bit latch.

Configurable bit latches 401–416 are conventional elements which can be programmed by the user of the PLD. FIG. 4 illustrates one example of configurable bit latch 401. Configurable bit latches 402–416 are identical to configurable bit latch 401. Configurable bit latch 401 includes pass transistors 421 and 422 and inverters 423–425. To program configurable bit latch 401, a programming (PROG) signal is asserted high to turn on pass transistors 421 and 422. The data value to be programmed into and configurable bit latch 401 is then applied to data line 426. This data value is stored in the latch structure formed by inverters 424 and 425. The PROG signal is de-asserted low after the data value is written to configurable bit latch 401. The data value and the inverse of the data value are then provided by inverters 424 and 425 to lines 427 and 428, respectively. Either of lines 427 and 428 can be used as the output terminal of configurable bit latch 401.

Once programmed, each of configurable bit latches 401–416 provide a logic "0" or a logic "1" value to its associated multiplexer input terminal. As described in more detail below, the manner in which configurable bit latches 401–416 are programmed determines the operation of carry logic circuit 300. Multiplexers 311–314 and configurable bit latches 401–416 effectively form four look-up tables.

The signals applied to the control terminals of multiplexers 311–315 determine which input terminals are coupled to the output terminals of multiplexers 311–314. For example, if input signal A is a logic "1" value and input signal B is a logic "0" value, then the "10" input terminals of multiplexers 311–314 are coupled to the respective output terminals of multiplexers 311–314. More specifically, the values programmed into configurable bit latches 402, 406, 410 and 414 are provided to the output terminals of multiplexers 311, 312, 313 and 314, respectively. Thus, multiplexers 311–314 and configurable bit latches 401–416 form four separate signal generator circuits, each of which operates in response to input signals A and B.

The output terminals of multiplexers 311, 312, 313 and 314 are connected to the "00", "01", "10" and "11" input terminals of multiplexer 315, respectively. One control terminal of multiplexer 315 is coupled to receive an input signal C which is provided by conventional logic forming circuitry (not shown) of the PLD. The other control terminal of multiplexer 315 is coupled to receive an input signal E, which is either an input signal D provided by conventional logic forming circuitry of the PLD or a carry input signal Cin from a previous carry logic circuit (not shown) similar to carry logic circuit 300. Multiplexer 321 selects input signal E to be either input signal D or carry input signal Cin based on a value programmed by the user into configurable bit latch 320. If configurable bit latch 320 provides a logic "0" signal to the control terminal of multiplexer 321, then multiplexer 321 selects input signal D. Conversely, if configurable bit latch 320 is programmed with a logic "1" value, then multiplexer 321 selects input signal Cin.

Multiplexer 315 operates in a manner similar to multiplexers 311–314 to select output signal S from the signals received from multiplexers 311–314. The output signal from multiplexer 311 is designated as a carry propagate signal P, and the output signals from multiplexers 312–314 are designated as intermediate output signals. Thus, if input signal C is a logic "1" value, and input signal E is a logic "0" value, then the intermediate output signal from multiplexer 312 is routed through multiplexer 315 as output signal S. Carry propagate signal P is used to create output signal S when both input signals C and E have logic "0" values.

Carry propagate signal P is also used to control the carry propagation function of carry logic circuit 300. To achieve this function, carry propagate signal P is provided to the control terminal of multiplexer 322. Multiplexer 322 passes an input signal G from the logic forming circuitry of the PLD if carry propagate signal P has a logic "0" value, and passes the carry input signal Cin if carry propagate signal P has a logic "1" value. The signal passed by multiplexer 322 is designated as carry output signal Cout. Carry output signal Cout is provided as a carry input signal, similar to Cin, to a subsequent carry logic circuit (not shown) which is similar to carry logic circuit 300.

Figure 5:
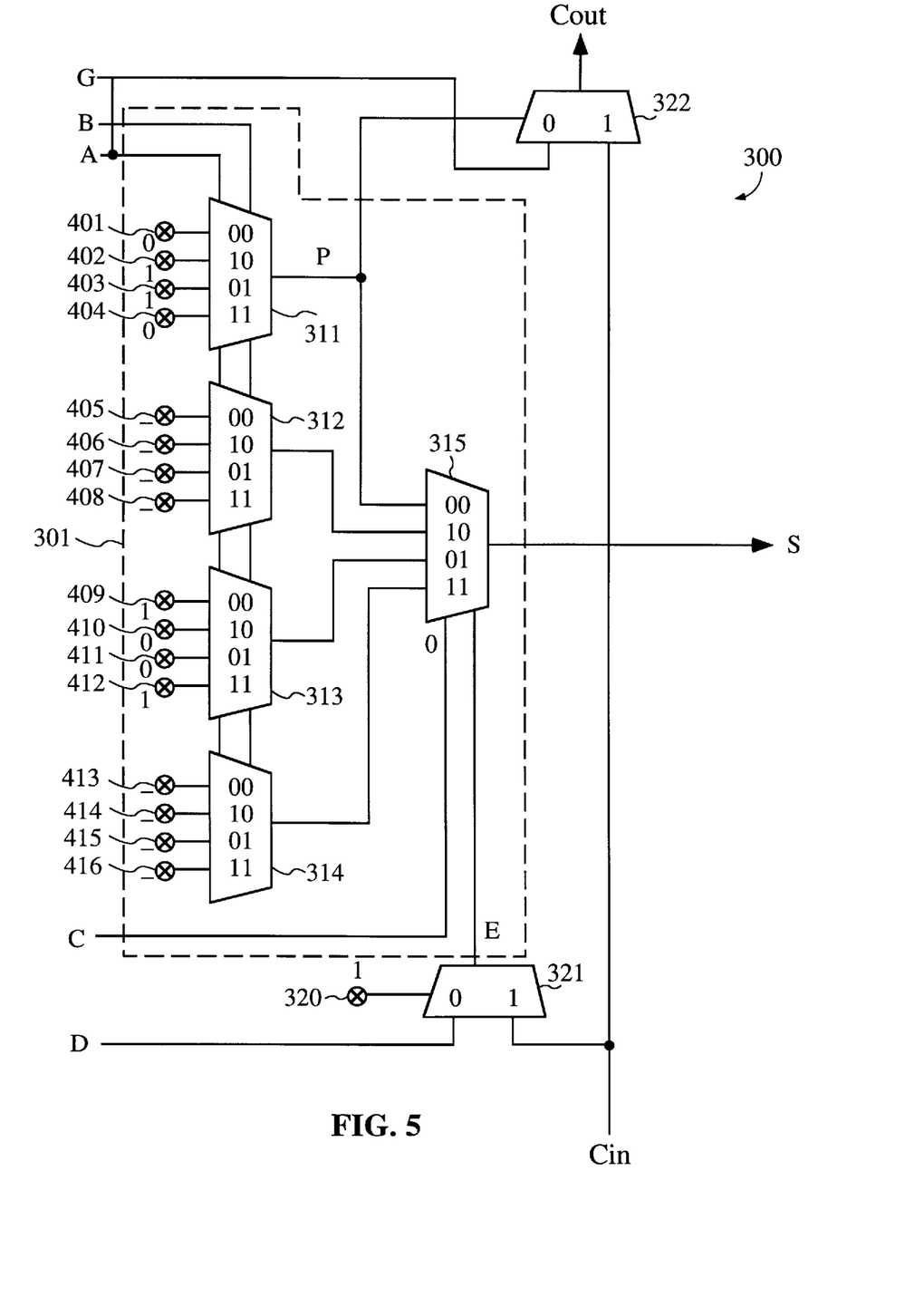
FIG. 5 is a schematic diagram of the carry logic circuit of FIG. 3 programmed to implement the carry chain circuit of FIG. 1.

Carry logic circuit 300 can be programmed to implement various logic circuits by programming configurable bit latches 320 and 401–416. FIG. 5 illustrates an embodiment in which carry logic circuit 300 is programmed to operate in the same manner as carry chain circuit 100 (FIG. 1). In this embodiment, configurable bit latch 320 is programmed with a logic "1" value, thereby causing carry input signal Cin to be provided to control multiplexer 315. Configurable bit latches 401, 402, 403 and 404 are programmed with logic "0", "1", "1" and "0" values, respectively, and configurable bit latches 409, 410, 411 and 412 are programmed with logic "1", "0", "0" and "1" values, respectively. Input signal C is selected to have a constant logic "0" value, thereby rendering the values programmed into configurable bit latches 405–408 and 413–416 immaterial in this embodiment (since multiplexers 312 and 314 will never be selected when input signal C has a logic "0" value). The terminal which receives input signal A is connected to the terminal for receiving input signal G. As a result, input signal A is provided to the "0" input terminal of multiplexer 322. Table 3 is a truth table for carry logic circuit 300 as programmed in the embodiment illustrated in FIG. 5. A comparison of Tables 1 and 3 shows that carry logic circuit 300 illustrated in FIG. 5 is functionally equivalent to carry chain circuit 100 of FIG. 1.

TABLE 3

| A | B | C | D | Cin | P | S | Cout |
|---|---|---|---|-----|---|---|------|
| 0 | 0 | 0 | — | 0 | 0 | 0 | 0 |
| 1 | 0 | 0 | — | 0 | 1 | 1 | 0 |
| 0 | 1 | 0 | — | 0 | 1 | 1 | 0 |
| 1 | 1 | 0 | — | 0 | 0 | 0 | 1 |
| 0 | 0 | 0 | — | 1 | 0 | 1 | 0 |
| 1 | 0 | 0 | — | 1 | 1 | 0 | 1 |
| 0 | 1 | 0 | — | 1 | 1 | 0 | 1 |
| 1 | 1 | 0 | — | 1 | 0 | 1 | 1 |

Carry propagate signal P is used to perform a carry propagation function and is also used to create output signal S. Thus, function generator 301 is effectively "split" to allow both carry propagate signal P and output signal S to be formed using only one function generator. Because only one function generator 301 is required to create both carry propagate signal P and output signal S, additional logic resources of the PLD are advantageously freed up for other uses.

Figure 6:
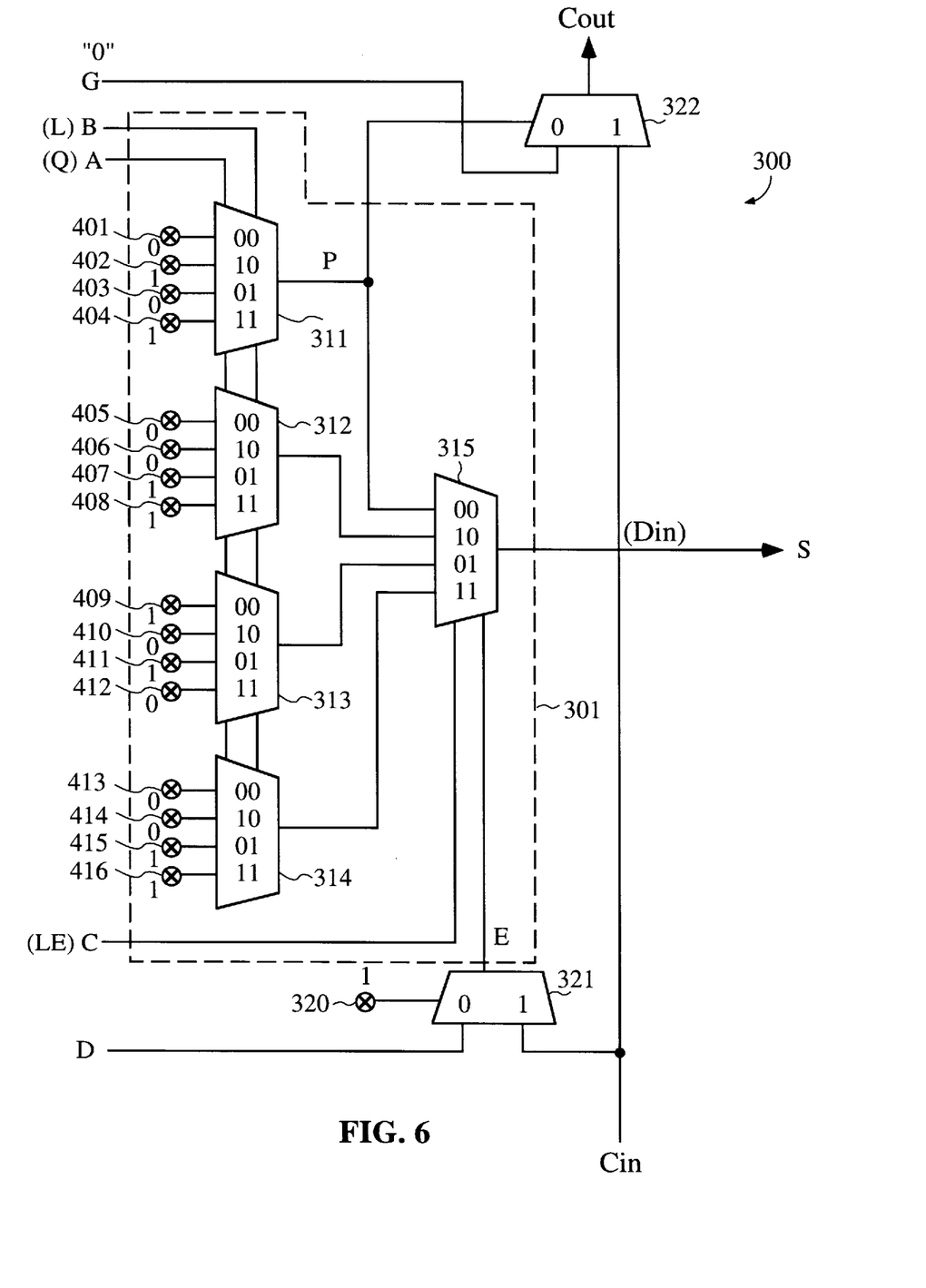
FIG. 6 is a schematic diagram of the carry logic circuit of FIG. 3 programmed to implement the loadable counter circuit of FIG. 2.

FIG. 6 is a schematic diagram which illustrates the programming of carry logic circuit 300 in accordance with another embodiment of the invention. In this embodiment, carry logic circuit 300 implements a loadable counter circuit which is functionally equivalent to loadable counter circuit 200 (FIG. 2). In this embodiment, configurable bit latch 320 is programmed with a logic "1" value, thereby causing carry input signal Cin to be provided to control multiplexer 315. Configurable bit latches 401–416 are programmed with logic "0", "1", "0", "1", "0", "0", "1", "1", "1", "0", "1", "0", "0", "0", "1", and "1" values, respectively. Input signal G is selected to have a constant logic "0" value, thereby providing a logic "0" value to the "0" input terminal of multiplexer 322.

In the embodiment illustrated in FIG. 6, signals A, B, C and S correspond to the signals Q, L, LE and Din of FIG. 2 and Table 2. Table 4 is a truth table for carry logic circuit 300 as programmed in the embodiment illustrated in FIG. 6. A comparison of Tables 2 and 4 shows that carry logic circuit 300 illustrated in FIG. 6 is functionally equivalent to carry chain circuit 200 of FIG. 2.

TABLE 4

| A (O) | B (L) | C (LE) | Cin | P | S (Din) | Cout |
|-------|-------|--------|-----|---|---------|------|
| 0 | 0 | 0 | 0 | 0 | 0 | 0 |
| 1 | 0 | 0 | 0 | 1 | 1 | 0 |
| 0 | 1 | 0 | 0 | 0 | 0 | 0 |
| 1 | 1 | 0 | 0 | 1 | 1 | 0 |
| 0 | 0 | 1 | 0 | 0 | 0 | 0 |
| 1 | 0 | 1 | 0 | 1 | 0 | 0 |
| 0 | 1 | 1 | 0 | 0 | 1 | 0 |
| 1 | 1 | 1 | 0 | 1 | 1 | 0 |
| 0 | 0 | 0 | 1 | 0 | 1 | 0 |
| 1 | 0 | 0 | 1 | 1 | 0 | 1 |
| 0 | 1 | 0 | 1 | 0 | 1 | 0 |
| 1 | 1 | 0 | 1 | 1 | 0 | 1 |
| 0 | 0 | 1 | 1 | 0 | 0 | 0 |
| 1 | 0 | 1 | 1 | 1 | 0 | 1 |
| 0 | 1 | 1 | 1 | 0 | 1 | 0 |
| 1 | 1 | 1 | 1 | 1 | 1 | 1 |

Again, function generator 301 is effectively split, with multiplexer 311 providing a carry propagate signal P which is used to perform a carry propagation function and to create output signal S (Din).

In addition to the circuits previously described, function generator 301 can be split to implement other circuits. To implement such other circuits, configurable bit latches 401–404 are programmed such that multiplexer 311 provides the desired carry propagate signal P in response to input signals A and B. Output signal S of function generator 301 can then be any function that shares the response of multiplexer 311. Tables 3 and 4 serve to illustrate this point. In the first four lines of Tables 3 and 4, carry propagate signal P is equal to the output signal S of function generator 301.

In a particular embodiment, carry propagate signal P is set to a logic "1" value by programming each of configurable bit latches 401–404 to provide a logic "1" value. As a result, the carry input signal Cin is routed through multiplexer 322 as the carry output signal Cout, regardless of the values of input signals A and B. If input signal C is set to a logic "1" value, then output signal S is generated by selecting from the signals passed by multiplexers 312 and 314. In this manner, carry propagate signal P can be eliminated from the equation used to generate output signal S which can be any function of input signals A, B, and D.

In another embodiment, the carry propagate signal P is set to a logic "0" value by programming each of configurable bit latches 401–404 to provide a logic "0" value. As a result, input signal G is routed through multiplexer 322 as the carry output signal Cout, regardless of the values of input signals A and B. The user can thereby select the carry output signal Cout to be provided by carry logic circuit 300 by selecting the value of input signal G. Again if input signal C is set to a logic "1", output signal S can be any function of input signals A, B, and D.

In yet another embodiment, carry logic circuit 300 is programmed to implement an equality comparator. In such an embodiment, input signal G is programmed to a logic "0" value and configurable bit latches 401–404 are programmed such that multiplexer 311 performs an exclusive NOR operation in response to input signals A and B (i.e., configurable bit latches 401 and 404 are programmed to provide logic "1" values, and configurable bit latches 402 and 403 are programmed to provide logic "0" values). If input signals A and B are equal, then the logic "0" value of input signal G is routed through multiplexer 322 as carry output signal Cout. If input signals A and B are not equal, then the carry input signal Cin is routed through multiplexer 322 as carry output signal Cout. If input signal C is set to a logic "1", output signal S can be any function of comparator input signals A and B and the input signal D.

Although the invention has been described in connection with several embodiments, it is understood that this invention is not limited to the embodiments disclosed, but is capable of various modifications which would be apparent to one of ordinary skill in the art. For example, other types of multiplexers, such as 3-to-1 or 5-to-1 multiplexers, can be implemented within function generator 301. Additionally, other multiplexer interconnections are possible. For example, multiplexer 315 can be implemented using more than one multiplexer. Furthermore, other numbers of multiplexers can be used within function generator 301. Thus, the invention is limited only by the following claims.

What is claimed is:

1. A carry logic circuit for a programmable logic device, comprising:
   a function generator having:
      a first input terminal for receiving a first input signal (A),
      a second input terminal for receiving a second input signal (B),
      a third input terminal for receiving a third input signal (C),
      a fourth input terminal for receiving a fourth input signal (E),
      a first output terminal for providing a carry propagate signal (P),
      a second output terminal for providing an output signal (S);
      a first signal generation circuit coupled to the first and second input terminals, wherein the first signal generation circuit provides a carry propagate signal (P) to the first output terminal in response to the first and second input signals (A,B),
      a second signal generation circuit coupled to the first and second input terminals, wherein the second signal generation circuit provides at least one intermediate output signal in response to the first and second input signals (A,B), and
      a first selection circuit coupled to the first and second signal generation circuits, wherein the first selection circuit routes one of the carry propagate signal and the intermediate output signals to the second output terminal of the function generator in response to the third and fourth input signals (C,E).

2. The carry logic circuit of claim 1, wherein the fourth input signal (E) is a carry input signal (Cin), the carry logic circuit further comprising a second selection circuit having a control terminal coupled to the first output terminal of the function generator, a first input terminal coupled to receive a fifth input signal (G) and a second input terminal coupled to receive the carry input signal (Cin).

3. The carry logic circuit of claim 2, wherein the first input terminal of the second selection circuit is coupled to the first input terminal of the function generator, such that the fifth input signal (G) is equal to the first input signal (A).

4. The carry logic circuit of claim 1, further comprising a second selection circuit having a first input terminal coupled to receive a carry input signal (Cin), a second input terminal coupled to receive a fifth input signal (D), a control terminal coupled to a programmable element and an output terminal coupled to the fourth input terminal.

5. The carry logic circuit of claim 1, wherein the first and second signal generation circuits each comprise:
   at least one multiplexer having control terminals coupled to the first and second input terminals; and
   a plurality of programmable signal generators, each coupled to a corresponding input terminal of the multiplexer.

6. The carry logic circuit of claim 5, wherein the programmable signal generators are configurable bit latches.

7. The carry logic circuit of claim 1, wherein the first selection circuit is a multiplexer having input terminals coupled to the first and second signal generation circuits, control terminals coupled to the third and fourth input terminals, and an output terminal coupled to the second output terminal of the function generator.

8. The carry logic circuit of claim 1, wherein the first signal generation circuit provides a carry propagate signal which is the exclusive OR of the first and second input signals.

9. The carry logic circuit of claim 1, wherein the first and second signal generation circuits comprise look-up tables.

10. A method of generating a carry propagate signal (P) and an output signal (S) using a single function generator of a programmable logic device, the method comprising the steps of:
   providing a first input signal and a second input signal to a first signal generating circuit within the function generator;

generating a first output signal with the first signal generating circuit in response to the first and second input signals;

providing the first and second input signals to a second signal generating circuit within the function generator;

generating at least one intermediate output signal with the second signal generator in response to the first and second input signals;

using the first output signal as the carry propagate signal; and selecting one of the first output signal and the intermediate output signals within the function generator as the output signal, wherein the step of selecting comprises the steps of providing a third input signal and a fourth input signal to the function generator, selecting the output signal in response to the third input signal and the fourth input signal, and selecting the fourth input signal from a group which includes a fifth input signal and a carry input signal.

11. A method of generating a carry propagate signal (P) and an output signal (S) using a single function generator of a programmable logic device, the method comprising the steps of:

providing a first input signal and a second input signal to a first signal generating circuit within the function generator;

generating a first output signal with the first signal generating circuit in response to the first and second input signals;

providing the first and second input signals to a second signal generating circuit within the function generator;

generating at least one intermediate output signal with the second signal generator in response to the first and second input signals;

using the first output signal as the carry propagate signal;

selecting one of the first output signal and the intermediate output signals within the function generator as the output signal;

transmitting the carry propagate signal, a carry input signal and a third input signal (G) to a signal selection circuit; and selecting a carry output signal to be the third input signal or the carry input signal in response to the carry propagate signal.

12. A function generator for a programmable logic device comprising:

a plurality of input terminals for receiving a corresponding plurality of input signals;

a first output terminal for receiving a first output signal;

a second output terminal for receiving a second output signal;

a plurality of independently programmable memory storage elements for storing a plurality of data values which define a function to be implemented by the function generator;

a selection circuit coupled to the memory storage elements, wherein the selection circuit routes a data value from a predefined subset of the memory storage elements to the first output terminal in response to a predefined subset of the input signals, and wherein the selection circuit routes a data value from the plurality of memory storage elements to the second output terminal in response to all of the input signals.

13. The function generator of claim 12, wherein the input signals comprise a first input signal, a second input signal and a carry input signal, the first output signal is a propagate signal, and the second output signal is a sum signal.

14. The function generator of claim 12, wherein the selection circuit comprises a first plurality of multiplexers, each having a plurality of multiplexer input terminals, wherein each of the multiplexer input terminals is coupled to a corresponding one of the memory storage elements.

15. The function generator of claim 14, wherein a selected one of the first plurality of multiplexers routes the data value from the predefined subset of the memory storage elements to the first output terminal in response to the predefined subset of the input signals.

16. The function generator of claim 14, wherein each of the first plurality of multiplexers passes a data value which is selected from a corresponding subset of the memory storage elements, the selection circuit further comprising a selection multiplexer coupled to receive the data values passed by the first plurality of multiplexers.

17. A method of operating a function generator, the method comprising the steps of:

programming a plurality of independently programmable memory storage elements with a corresponding plurality of data values which define a function to be implemented by the function generator;

providing the data values stored in the memory storage elements to a selection circuit;

providing a plurality of input signals to the selection circuit;

routing a data value from a predefined subset of the memory storage elements, through the selection circuit, to a first output terminal in response to a predefined subset of the input signals; and routing a data value from the plurality of memory storage elements, through the selection circuit, to a second output terminal, in response to all of the input signals.

* * * * *